United States Patent [19]

Quarton

[11] 4,074,281

[45] Feb. 14, 1978

[54] METHOD AND APPARTUS FOR MAKING HARD COPY RECORDS OF CURVES INCLUDING CURVES WHICH ARE MATHEMATICALLY DESCRIBED AS MULTI-FUNCTIONS FROM PERIODICALLY SAMPLED DATA POINTS

[75] Inventor: William T. Quarton, Englewood, Colo.

[73] Assignee: Honeywell Inc., Minneapolis, Minn.

[21] Appl. No.: 717,996

[22] Filed: Aug. 26, 1976

[51] Int. Cl.$^2$ ............................................... G06G 7/30
[52] U.S. Cl. ......................... 346/110 R; 340/324 AD; 364/718; 364/723
[58] Field of Search ..................... 346/110 R, 33 ME; 340/324 A, 324 AD; 235/151, 152

[56] References Cited

U.S. PATENT DOCUMENTS

| | | | |
|---|---|---|---|
| 3,605,109 | 9/1971 | Tyler | 346/110 R X |
| 3,686,662 | 8/1972 | Blixt | 340/324 A |
| 4,038,668 | 7/1977 | Quarton | 346/110 R X |

*Primary Examiner*—Joseph W. Hartary
*Attorney, Agent, or Firm*—Laurence J. Marhoefer

[57] ABSTRACT

A line scan cathode ray tube (CRT) recorder generates a hard copy record of a curve from stored data representing the X-Y coordinates of a series of sample points along the curve. The curve may be described mathematically by a multi-valued function. One pass of the recording media past a linear sweeping CRT beam records the entire curve in a predetermined number of recording sweeps. The distance ($\Delta X$ and $\Delta Y$, respectively) between each and every $X_n$, $Y_n$ and the next successive stored sample point $X_{n+1}$, $Y_{n+1}$ is determined prior to each recording sweep of the beam and these distances, $\Delta X$ and $\Delta Y$, are divided by a predetermined number to give a factor interpolating the distance between successively stored data points ($X_n$ and $X_{n+1}$ and $Y_n$ and $Y_{n+1}$). Each recording sweep of the beam represents a band (in the X-axis direction, for example) on the recording media of finite width extending from one recording sweep position up to, but not including, the next recording sweep position. The X-Y coordinates of each sample point are successively incremented by the interpolative value $\Delta X/n$ and $\Delta Y/n$, respectively, where "$n$" equals the number of interpolative steps. The Y-axis coordinate positions of the interpolative value ($Y + [n \Delta Y/n]$) are stored corresponding to the interpolative X-axis coordinate ($X + [n \Delta X/n]$) positions within the finite band to be recorded. As the beam sweeps along a given X-axis position, it records a short line for each stored Y-axis position.

6 Claims, 8 Drawing Figures

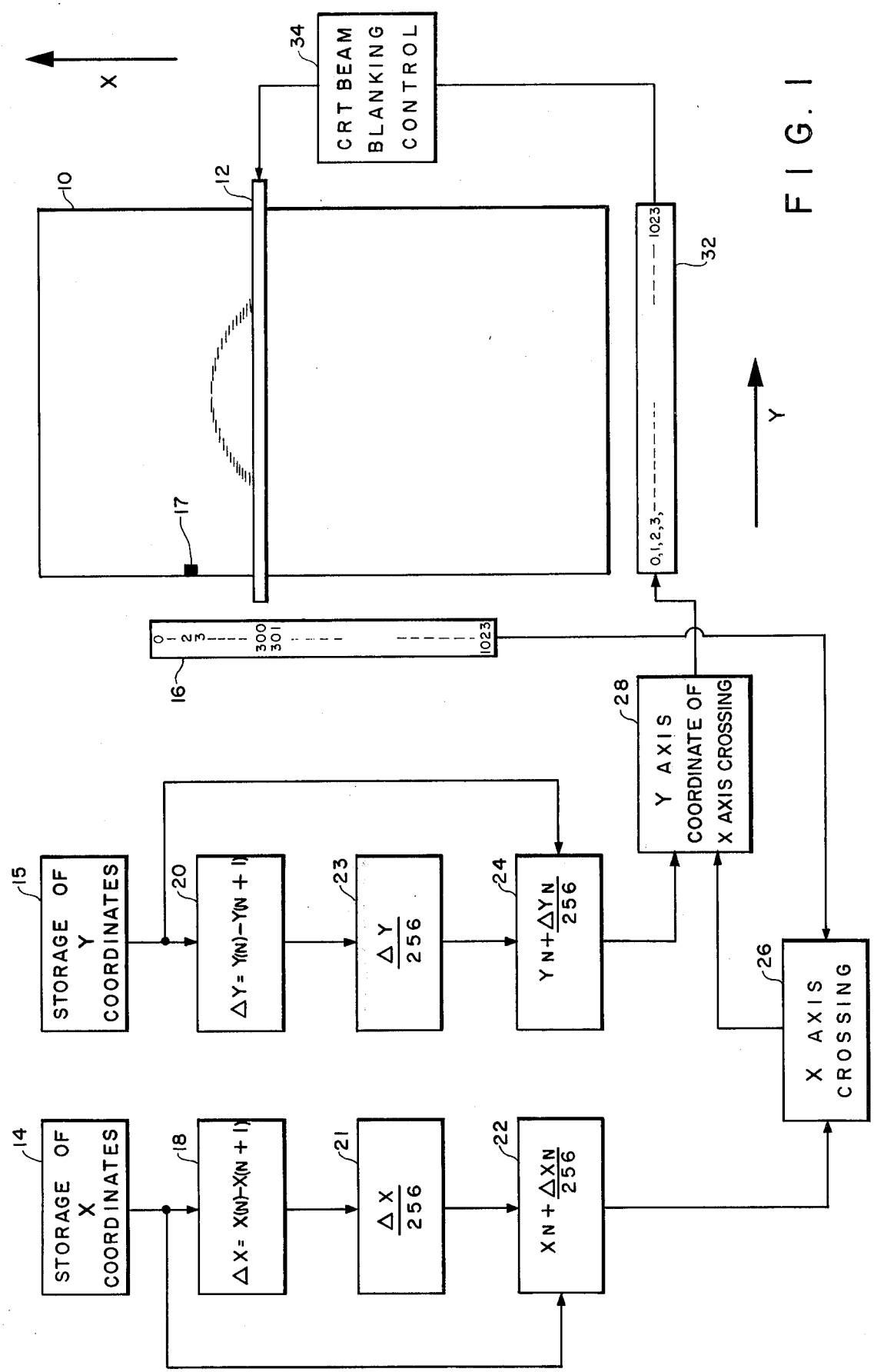

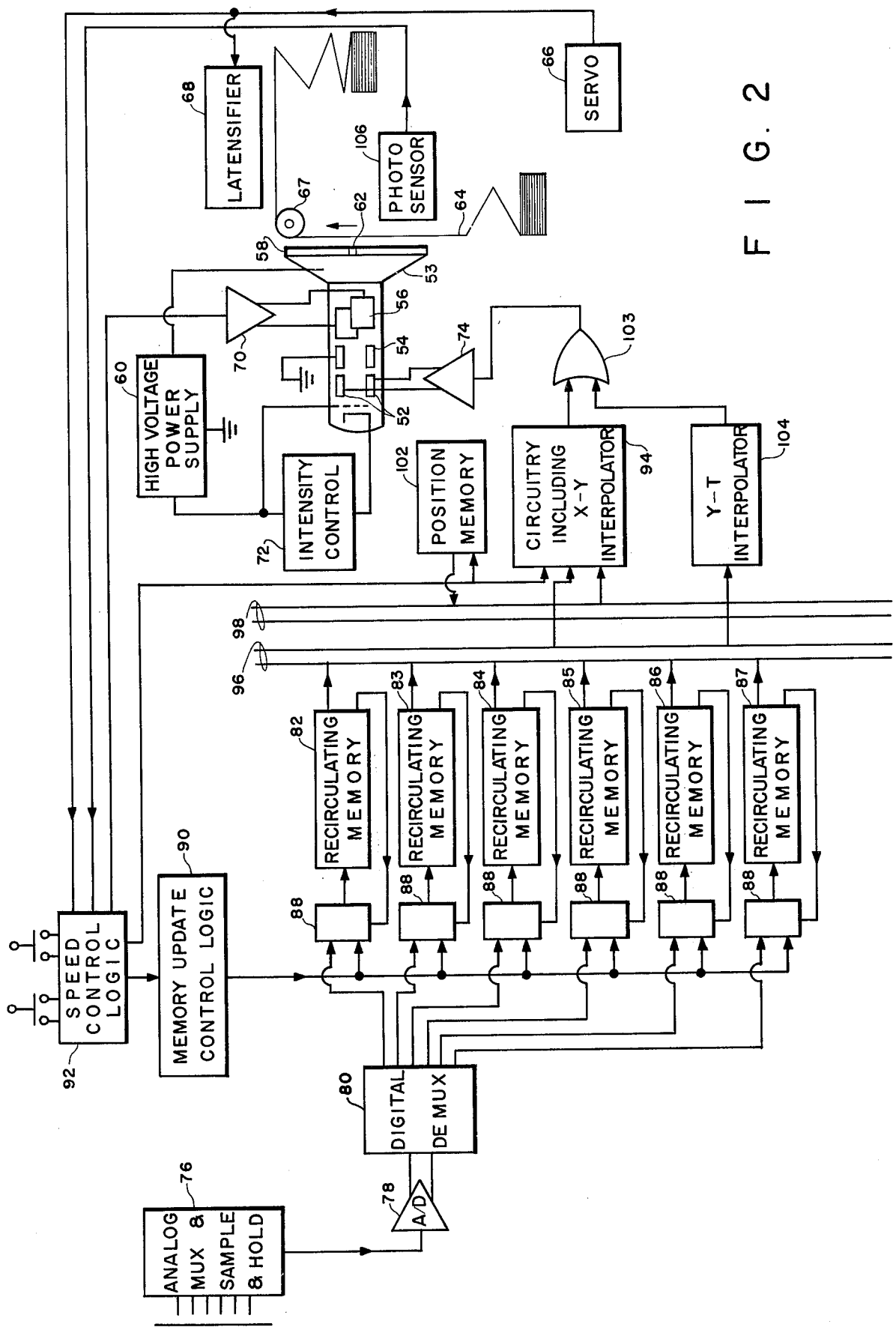
F I G. 2

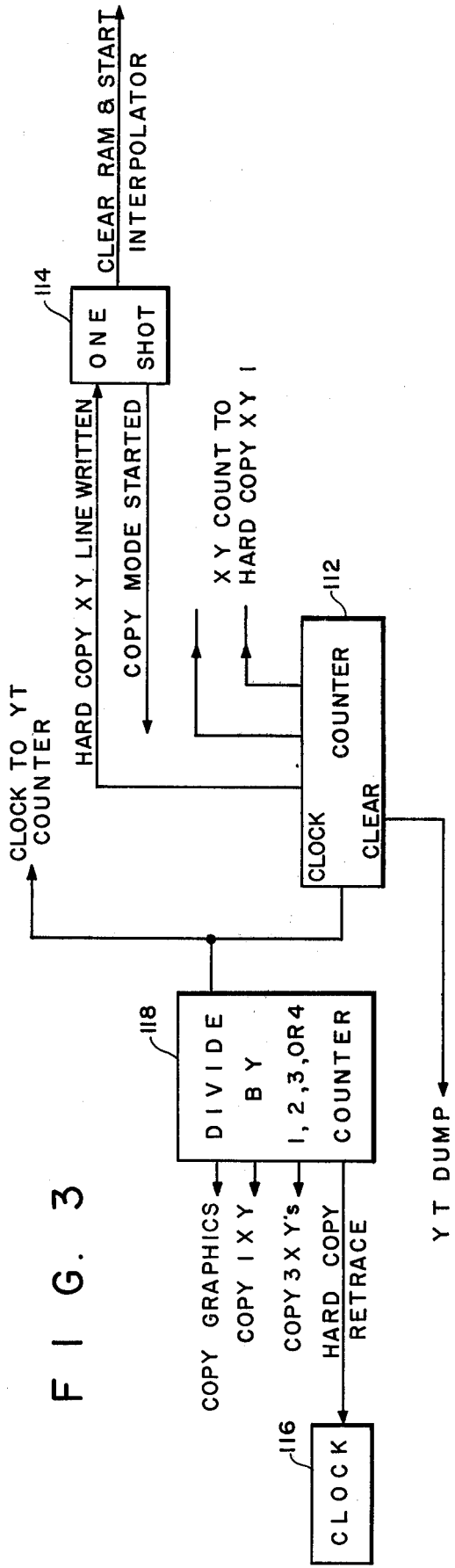
F I G. 3
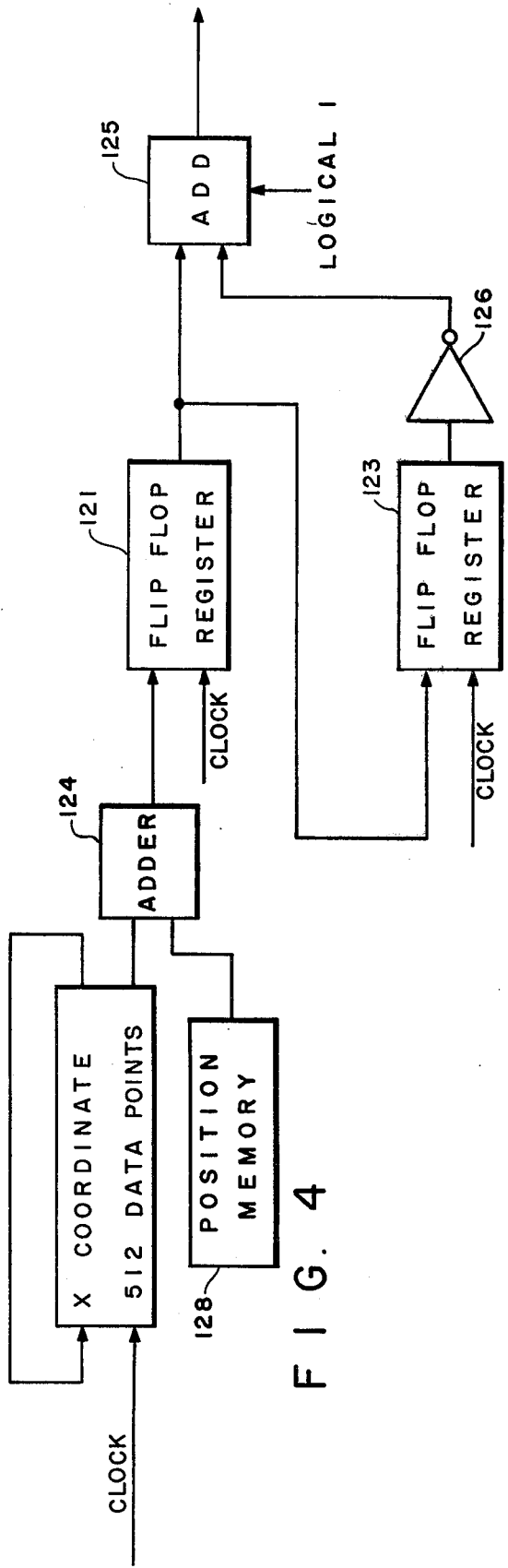
F I G. 4

METHOD AND APPARTUS FOR MAKING HARD COPY RECORDS OF CURVES INCLUDING CURVES WHICH ARE MATHEMATICALLY DESCRIBED AS MULTI-FUNCTIONS FROM PERIODICALLY SAMPLED DATA POINTS

Subject matter disclosed in this application but not claimed herein is disclosed and claimed in my prior application bearing Ser. No. 627,794, filed Oct. 31, 1975, now U.S. Pat. No. 4,038,668.

BACKGROUND OF THE INVENTION

1. Field of the Invention

This invention relates to a method of and apparatus for producing hard copy displays of data signals, for example, analog physiological signals, and, in particular, plots of multi-valued functions. One example of a multi-valued function is a circle, the mathematical equation for which is $X^2 + Y^2 = r^2$ where $r$ is the radius of the circle. This relationship may also be stated as $X = \pm \sqrt{r^2 - Y^2}$. From this equation it is apparent that for each value of X there exists two values Y and vice versa. There are many, many other multi-valued functions. Curves of multi-valued functions, particularly when plotted on hard copy, are useful in the medical field; for example, such curves can indicate a relationship between heart beat signals derived from several different parts of the body. Such signals from three different planes in the body (referred to as the frontal, horizontal, and sagittal) are useful in the diagnosis of abnormal heart conditions.

2. Description of the Prior Art

Apparatus for providing single-channel or multichannel hard copy displays of curves and/or records of the amplitude variations of periodically sampled analog data signals are known in the prior art. In one such known form of apparatus, the values of a plurality of data signals are plotted on a moving photosensitive record sheet by means of a cathode ray tube (CRT) operaating essentially in a single line scan mode. U.S. Pat. No. 3,605,109, assigned to the assignee of the present invention, shows a CRT system of this type. In that system, graphic displays are produced from periodically sampled analog data signals in a so-called connected sampling method the yields substantially continuous, and hence, readily discernible curves, notwithstanding the periodic nature of the sampled data from which the curves are produced. The traces are obtained by producing successive substantially parallel lines on a photosensitive record sheet that is arranged to move past the face of a normally blanked CRT operated in a line scan mode.

This prior art apparatus is generally satisfactory. However, it cannot generate a record of a multi-valued function from a series of stored sample data points.

SUMMARY OF THE INENTION

Accordingly, it is an object of the present invention to provide a method of and apparatus for producing hard copy graphic displays or plots of multi-valued functions with a line scanning CRT hard copy recorder.

Another object of the invention is to provide a method of and apparatus for producing hard copy plots of multi-valued functions from periodically sampled stored data, which plots approximate smooth and continuous traces or curves faithfully representing the multi-valued function or functions.

Another object of the invention is to provide such an improved hard copy producing apparatus in which the traces or curves representative of multi-valued functions are obtained by drawing successive substantially parallel lines on a display medium such as a photosensitive record sheet, the latter being arranged to move past the face of a CRT that is operated in a line scan mode.

Briefly, the present invention contemplates recording a hard copy display of a curve which may mathematically be described by a multi-valued function from digitally stored data representing the X-Y coordinates of a series of sample points taken along the curve. While the number of sample points and various other parameters, such as the number of interpolative steps and the number of sweeps used to generate the curve, may be varied to suit a particular application, specific examples in accordance with a preferred embodiment of the invention will be given here solely for the purpose of assisting in readily understanding the invention.

In accordance with one specific embodiment of the invention, 512 data points are stored and the hard copy record of the curve is recorded in 1024 sweeps of the CRT beam along the Y-axis of a recording media as the media moves at a predetermined control speed along the X-axis. For each recording sweep of the beam, the 512 stored data points are all scanned. This is accomplished in the interval between recording sweeps. For each stored point, virtual or interpolated data points are computed between the coordinate positions, $X_n$ and $Y_n$, and the coordinate positions of the next successive stored sample data points $X_{n+1}$ and $Y_{n+1}$. A value $\Delta X$ and $\Delta Y$, respectively, is calculated and these values are divided by the number of desired interpolative steps, 256, for example.

The entire curve is generated in a fixed number of recording sweeps of the CRT beam and, therefore, each sweep represents a finite band on the recording media extending from one X-axis sweep position up to but not including the next X-axis sweep position. The X-axis and Y-axis values are incremented by successive cumulative applications of the calculated interpolative value and the corresponding Y-axis coordinate is recorded if and when the interpolative value of its corresponding X-axis coordinate is in the finite sweep band. In order to record a curve continuous in its appearance from these sample data values, the CRT beam makes an appropriate mark for the stored Y-axis positions.

BRIEF DESCRIPTION OF THE DRAWINGS

A better understanding of the present invention may be had from the following detailed description when read in connection with the accompanying drawings wherein:

FIG. 1 is a simplified block diagram illustrating the invention.

FIG. 2 is a partial schematic and partial block diagram of one embodiment of the invention;

FIG. 3 is a simplified schematic diagram of a circuit for determining the position of the recording media with respect to the CRT beam;

FIG. 4 is a simplified schematic diagram of a circuit for determining the values of $\Delta X$ and $\Delta Y$ between adjacent sample points;

DESCRIPTION OF THE PREFERRED EMBODIMENT

Referring now to FIG. 1, as a recording medium 10 (light sensitive paper, for example) moves upwardly (the direction of the vertical arrow; X-axis direction) past a fiberoptic band 12 embedded in the face of a CRT (not shown), the CRT electron beam continuously sweeps back and forth between the lefthand edge of the medium 10 and its righthand edge. The horizontal arrow denotes this motion of the beam; it is the Y-axis.

Normally, the electron beam is blanked; when it is unblanked, it marks the paper. Such CRT recording devices are well known in the art and are described in greater detail in U.S. Pat. No. 3,605,109, for example.

Figure 1A:
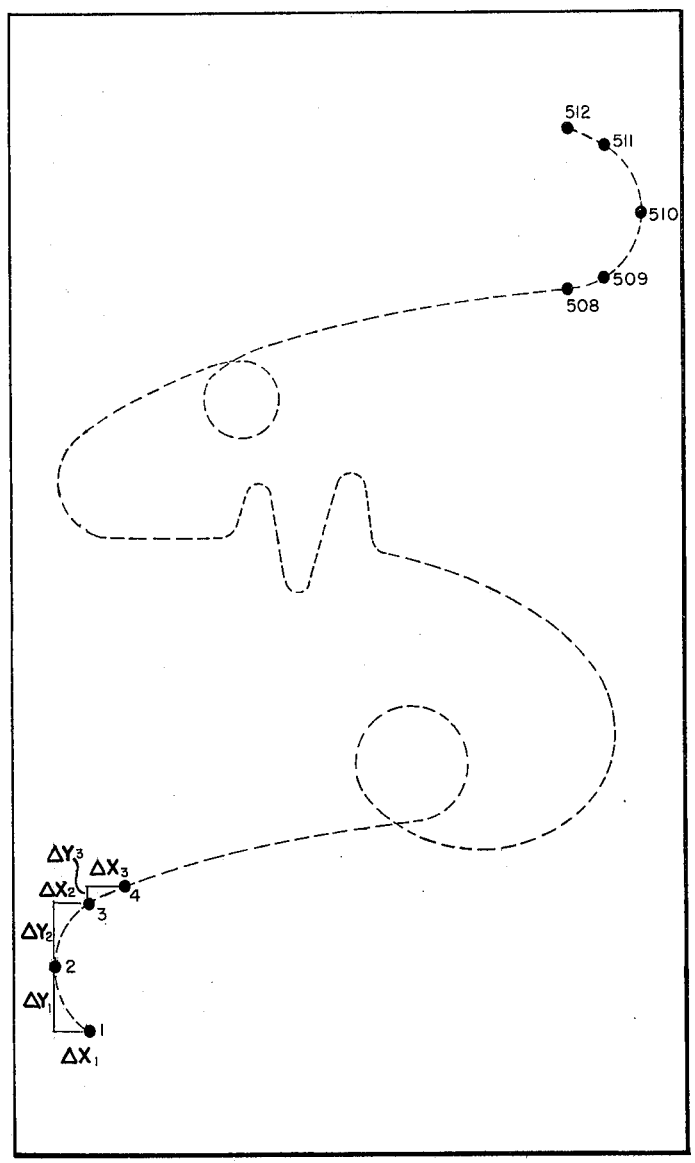
Figure 1a shows a multi-value function.

To record a curve, such as the multi-valued function 20 shown in FIG. 1a, a series of periodically taken samples at points along the curve are used (512 samples, for example). The X and Y coordinate of each of these sample points is stored, preferably in suitable digital memory storage devices 14 and 15.

Apparatus in accordance with the present invention records a generally continuous appearing representation of a curve such as the curve of FIG. 1a in a fixed number of recording sweeps of the beam in a single pass of the medium past the fiberoptic recording head 12.

The motion of the medium 10 is suitably controlled to the end that the position of the medium relative to the head 12 is known. Conveniently, a counter 16 is advanced one count each time the medium moves through a distance equal to the distance between successive recording sweeps of the beam. With the paper motion closely controlled to a fixed speed, the counter 16 may be advanced a single increment at fixed intervals, starting with a mark 17 which marks the top of the field in which the curve is to be recorded. A photosensitive detector may be used to sense the mark 17. In one specific embodiment of the invention, 1024 recording sweeps of the beam have been satisfactorily used to record a field of about seven inches (7 ins.) in the X-axis direction. In that embodiment, the distance on the moving medium between recording sweeps is 7/1024 inches. Thus, it will be appreciated that each recording sweep of the CRT represents a band 0.007 inches in width, although the beam itself is not necessarily that size and the width of a line recorded on hard copy may be greater or less than this band width.

Here, it should be noted that the X-axis ordinate of any particular stored sample point does not necessarily coincide with the X-axis coordinate of any particular recording scan of CRT beam. That is to say, the X-axis coordinate of the stored sample point may, and often does, lay between the X-axis coordinates of two successive recording scans. It should further be noted that the blanked beam may scan continuously at a relatively high rate. In this case, only one scan in a predetermined number (40, for example) is a recording scan.

Prior to the commencement of each sweep of the electron beam during which information is to be recorded (i.e., a recording scan), the X and Y coordinate of all 512 sample points are successively readout of the memories 14 and 15 and digital circuits 18 and 20 calculate the X coordinate distance and the Y coordinate distance from each sample point to the next successive sample point. Referring to FIG. 1a, these distances are denominated $\Delta X_1$ and $\Delta Y_1$ between points 1 and 2 and $\Delta X_2$ and $\Delta Y_2$ between points 2 and 3. These distances are calculated for each of the successive pairs of points in accordance with a generalized formula $\Delta X_n = X_n - (X_{n+1})$ and $\Delta Y_n = Y_n - (Y_{n+1})$.

The X-axis coordinate distance $\Delta X$, and the Y-axis coordinate distance, $\Delta Y$, between two successive stored data points is interpolated by dividing these distances by a convenient constant such as 256, for example, by means of conventional digital logic techniques represented by boxes 21 and 23. A digital adder 22 adds the value ($\Delta X_n/256$) to each $X_n$ two hundred and fifty-six times so as to calculate a value of X for each interpolative position $X_n$ and $X_{n+1}$. Simultaneously, an adder 24 adds the value ($\Delta Y_n/256$) to the corresponding Y-axis coordinate of the point $Y_n$ two hundred and fifty-six times in order to determine a Y-axis coordinate value for each interpolative position between $Y_n$ and $Y_{n+1}$.

As previously explained, in using a fixed member of recording scans, such as 1024, for example, in recording a figure in one record field, each scan corresponds to a finite width along the recording medium in the X-axis direction. This band may be defined as extending from one scan line position up to but not including the next scan line position. An X-axis crossing detector 26 produces a suitable output each time the interpolated output from adder 22 crosses into or out of the finite band associated with the scan of the beam to be recorded.

The outputs of adder 24 and X-axis crossing detector 26 are coupled as inputs to digital logic circuitry represented by box 28 which produces output signals indicative of the interpolated values $Y_n + a \cdot \Delta Y_n/256$ which occur while the interpolated values of $X_n + a \cdot \Delta X_n/256$ are within the finite band. Each output signal from circuit 28 is stored as a change (from binary "0" to binary "1", for example) in state in an appropriate location in a register 32. Conveniently, register 32 may contain 1024 locations. The output of register 32 controls the CRT blanking circuit 34 to the end that the beam is unblanked for a short interval for each binary "1" stored in the register. The beam thusly draws a continuous line segment on the medium between the Y-axis coordinate of the sample point on the curve whose X coordinate entered the finite band and the Y-axis coordinate of the sample point on the curve whose X coordinate left the band.

Referring now to FIG. 2 which shows a specific embodiment of the invention for making a hard copy of physiologically derived information, a CRT operated in a line scan mode has a pair of beam gating plates 52, an anode 54, horizontal beam deflecting plates 56, a display screen or faceplate 58 and a source of high voltage 60. The CRT has a fiberoptic array or strip 62 formed into its faceplate 58.

A photosensitive record sheet or paper 64, also referred to hereinafter as hard copy, is advanced by a suitable servo motor 66 and capstan 67 at a predetermined rate upward, as seen in FIG. 1, past the CRT faceplate and fiberoptics strip 62. A latensifier 67 is provided to latensify latent images that are produced on the photosensitive sheet in a manner known in the art.

The CRT also has a horizontal deflection amplifier 70, an intensity control 72, and a blanking amplifier 74. The beam gating plates 52 are connected to the output of a blanking amplifier 74. When at the same potential, the beam gating plates 52 cause no deflection of the beam as the beam passes through the anode aperture. If there is a voltage between the plates 54, the beam is deflected and misses the aperture and, thus, is prevented from reaching the screen of the CRT. Typically, there is no proportional control of intensity of the beam. That is, the beam is either on the fiberoptic strip (unblanked) or off the strip (blanked). In each case, the cathode of the CRT emits full current.

Signals, for example, analog physiological signals in the range of −5 to +5 volts from several sources are coupled as inputs to an analog multiplexing (MUX) and sample and hold circuit 76. Each input signal to the circuit 76 from each of the various sources is sampled at a constant high rate and held for conversion for an analog to digital signal 78. The analog data coupled to the input of an A–D converter 78 is converted to a binary digital signal, for example, to 10 bit resolution, at a constant high rate such as 7 KHz. In the specific embodiment, the A–D converter makes each conversion in less than 25 microseconds ($\mu$sec). The digital output of the A–D converter 78 is connected to the input of a digital demultiplexer 80 which couples the digital A–D converter output into six separate display refresh or recirculating memories 82, 83, 84, 85, 86, 87 and an associated gating means 88, respectively, couples the output of the digital demultiplexer to the memories.

Each memory in this specific embodiment is a 512 word shift register in which the data words are arranged sequentially. As a new word is gated into the memory shift register, the oldest one drops out. The output information from the memories, therefore, is arranged for continuous updating by new data at a rate which is under control of a memory update control logic circuit 90. A speed control logic circuit 92 controls a synchronous memory update logic circuit 90 and the servo motor 66, the latensifier 67, the horizontal amplifier 70 and the X-Y interpolation circuitry represented in FIG. 2 by box 94.

The data in the shift registers 82 through 87 can be selectively connected to a data bus 96. The data bus carries data on command from a given memory to one or more of several apparatus components that use the data. The component users of the data may comprise, in addition to the hard copy recorder, which is the subject of this invention, other equipment, such as, for example, a display CRT for the operator to view signal waveforms, or for a programmable digital computer. The sources may be connected to the data bus tri-state logic circuitry and are disconnected from it when not required. The different component users of the data bus can use the bus at different phases of a multi-phase clock. This invention is directed to making a hard copy recording of a curve generally continuous in appearance from the X-Y coordinates of stored sample points. The manner in which the points are acquired and the other uses to which the information may be put do not form part of the invention and are given here to illustrate one typical use for the invention. Thus, the manner in which data is entered into the memories are details of the bus arrangement will not be further explained in detail.

The information in memories 82 and 83, for example, may be used to generate a pattern on a cathode ray tube display (not shown) by using the data in memory 82 to control the X-axis deflection of the beam and the corresponding data in memory 83 to control the Y-axis beam deflection. Typically, the pattern to be produced is a multi-valued function in medical applications, and this same stored data can be used to generate a hard copy record of the curve in accordance with the present invention.

In making a hard copy display of the curve from the sample points stored in data memory 82 and memory 83, for convenience referred to herein as X-data and Y-data, respectively, any gaps between the sample points should be filled so as to make a curve generally continuous in its appearance. A control circuit takes position data from a position bus 98, produced in a suitable manner, and holds it in a digital position memory 102 provided for the purpose. The position data may include offset data to be added to channel memory data to position the origin of the X or Y-axis anywhere on the display screen or paper. Photosensor 106, which senses a suitable marker on the paper 64, is used in combination with an oscillator and counter to indicate X-axis paper travel. The paper is controlled to move at a constant predetermined speed. Counting the output of the oscillator establishes the position of the web or paper relative to the mark and, since the distance between the sensor and the fiberoptic strip 62 can also be established accurately, the position of the web or paper relative to the strip is determined.

As noted hereinbefore, the hard copy recorder of the present invention works in the line scan mode employing a fiberoptic CRT. Pulse data switches the beam of the CRT on and off. These display control circuits includes a Y-T interpolator 104, the X-Y interpolator 94, and a hard copy beam control device OR gate 103.

Control logic 92 provides horizontal synchronizing pulses to repetitively sweep the cathode ray beam along the length of the fiberoptic strip. To that end, an output of the circuit 92 is connected to the input of the amplifier 70 whose output is connected to the horizontal deflecting plates of the CRT. Normally, the cathode ray beam is blanked; unless unblanked, horizontal sweeps of the CRT are not effective to produce marks or traces on the photosensitive sheet. The cathode ray beam is selectively unblanked by an output from amplifier 74 which, in turn, is controlled by a hard copy beam control gate 103. In a specific embodiment, the beam is blanked during 39 successive sweeps and is selectively unblanked during the course of its fortieth sweep.

The latensifier 68 latensifies the latent images produced on the photosensitive sheet in a manner known in the art. The intensity of the radiation produced by the latensifier is controlled by the logic circuit 92 in accordance with the speed at which the photosensitive sheet is moved past the faceplate and fiberoptic strip of CRT. A manual control device, for example, a push button selector switch may be provided for the logic circuit 92 to facilitate manual adjustment in the said speed of the photosensitive sheet.

To control the rate at which the paper moves past the faceplate of the CRT, a distinguishing mark, for example, a black mark, is provided at a predetermined space interval on the edge. Specifically, the paper may be provided, in perforated sheets, with a black mark at the beginning of each sheet. A photosensor 106 scans the edge of the photosensitive strip. The photosensor may be of known type and operates when it sees the black mark to start the operation of the apparatus to display a multi-values function. To this end, the photosensor 106 is suitably connected to the speed control logic circuitry 92.

In order to determine the precise position of the paper 64 with respect to the fiberoptic strip 62, a logic scheme of the type shown in FIG. 3 may be used to indicate X-axis paper travel. When the photosensor 106 is exposed to or "sees" the black mark on the photosensitive strip, it operates to start a counter 112. The count of the counter 112 is suitably related to the paper position so that it conveniently begins with a "0" count at the leading end of the field to be printed and ends with a count of 1023 at the trailing end of the field. The paper may be moved at a speed of about 13 millimeters per second. As a result of the relationship betwee paper movement and the count of the counter, the latter identified the line on each strip of the paper upon which the CRT is then operative to record. In a preferred embodiment, the copy to be printed is 5.5 inches (13.97 cm.) long and is centered between perforations on the 11 inches (27.94 cm.) strip of paper.

Associated with the X-Y counter is a "One Shot" multivibrator 114, a clock oscillator 116 and a divide by 1, 2, 3 or 4 counter 118. The purpose of this counter is to take into account the effect of a reduction in the speed at which the paper is moved when more than one single multi-valued function is to be plotted. Typically, if two curves are to be plotted, the paper speed is reduced to one-half speed. If three, the paper speed is reduced to one-third speed and so on in order to allow sufficient time for carrying out the interpolative steps.

A number of digital logic circuits will be apparent to those skilled in the art and may be used for determining successive values of $\Delta X_n$ and $\Delta Y_n$ for the data points stored in memories 82 and 83. Here it should be noted that in calculating the successive values of $\Delta X$ and $\Delta Y$ it is convenient to determine and store the sign of $\Delta X$ and $\Delta Y$ in order to establish the relative position of one data point relative to the next data point; i.e., up, down, right or left.

FIG. 4 shows a greatly simplified block diagram of one circuit for determining $\Delta X_n$; it will be appreciated that the same logic scheme can be used for determining $\Delta Y_n$. However, in a preferred embodiment of the invention, a multiplexing technique may be employed so that many of the same logic elements may be used for determining both $\Delta X$ and $\Delta Y$.

Under control of a clocking signal, an adder 124 adds the successive values of X to the contents of a position memory 126 and the resultant binary values are successively loaded into a flip-flop register 121. The value in register 121 represents $X_{n+1}$. The previous value of X is transferred to register 123 and the value stored in this register represents $X_n$. Inverter 126 complements the data in register 123. A binary adder 125 adds the contents of register 121 to the complemented contents of register 123 plus a carry input of logical "1" to give a resultant output in 2's complement.

The output of the adder 125 comprises ten bits plus a sign in 2's complement to provide digital information representative of $\Delta Y$, that is, $(Y_{n+1} - Y_n)$, or $\Delta X$, that is, $(X_{n+1} - X_n)$. The sign represents $\Delta Y$ and $\Delta X$ greater than or less than zero and thereby indicates the relationship of sample points. This process is repeated for all 512 data points.

Figure 5:
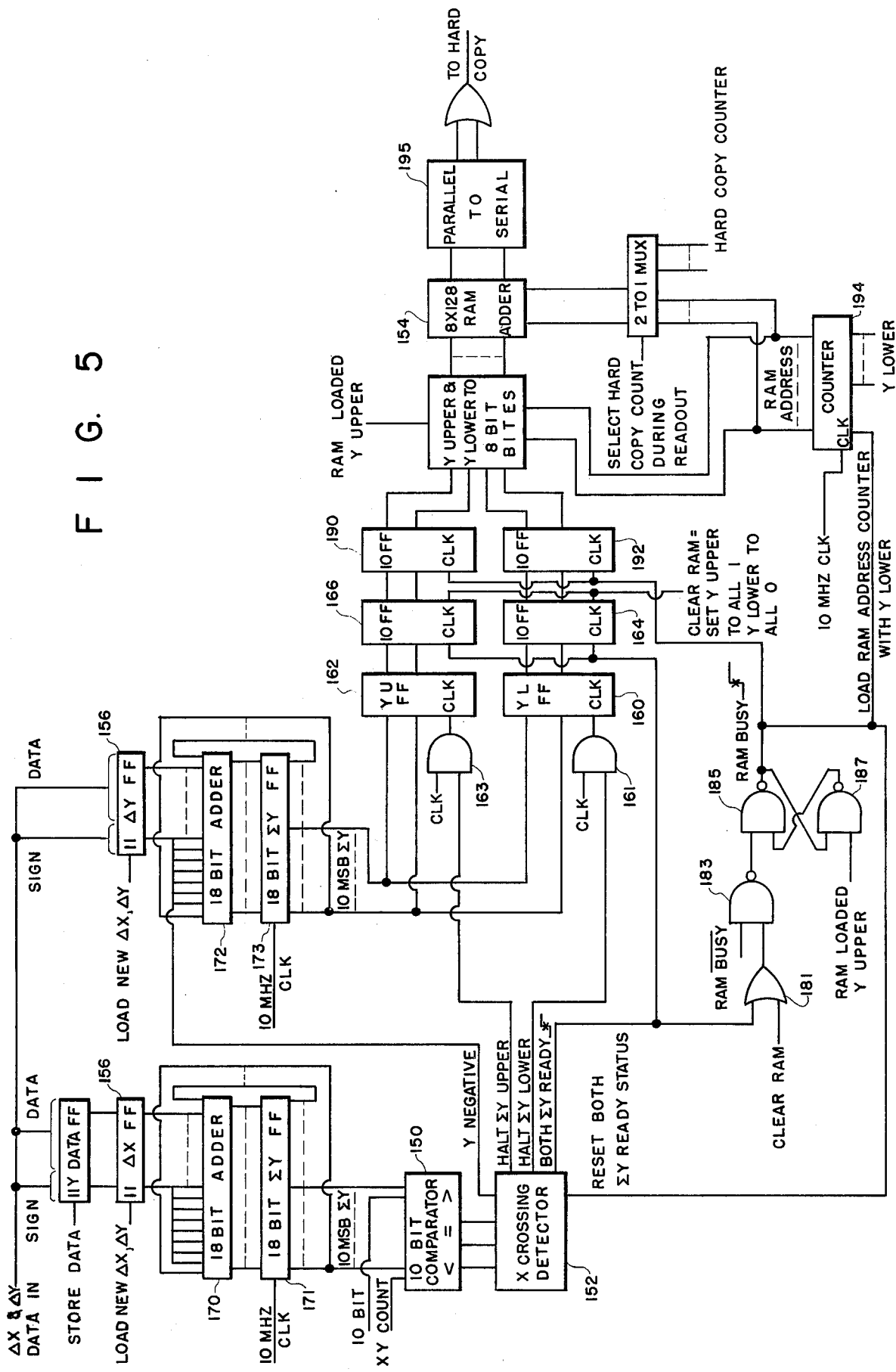
FIG. 5 is a partial schematic and partial block diagram showing details of the XY interpolator circuitry.

FIG. 5 is a block diagram illustrating additional portions of the X-Y interpolator 94 including a digital comparator 150, an "X" crossing detector 152, a random access memory (RAM) 154 and associated circuitry further to be described for storing information and for reading out that information to produce graphic traces.

The speed at which the apparatus of FIG. 5 interpolates can limit the speed of the photosensitive sheet during the recording mode. In order to maximize processing speed (Schottky TTL) synchronous logic desirably may be employed where appropriate in the circuitry of FIG. 5, as those skilled in the art understand.

The values to be interpolated are applied to the input terminal labeled $\Delta X$ and $\Delta Y$ DATA IN in FIG. 5. This data may be obtained from the output of the adder of FIG. 4 and is connected to the inputs of latches 156 where it is stored until it can be used.

It should be noted that the information applied to the interpolator from the adder of FIG. 4 also includes bits indicating whether the Y values are going positive or negative. This has been indicated in FIG. 5 by the notation "SIGN."

Figure 6:
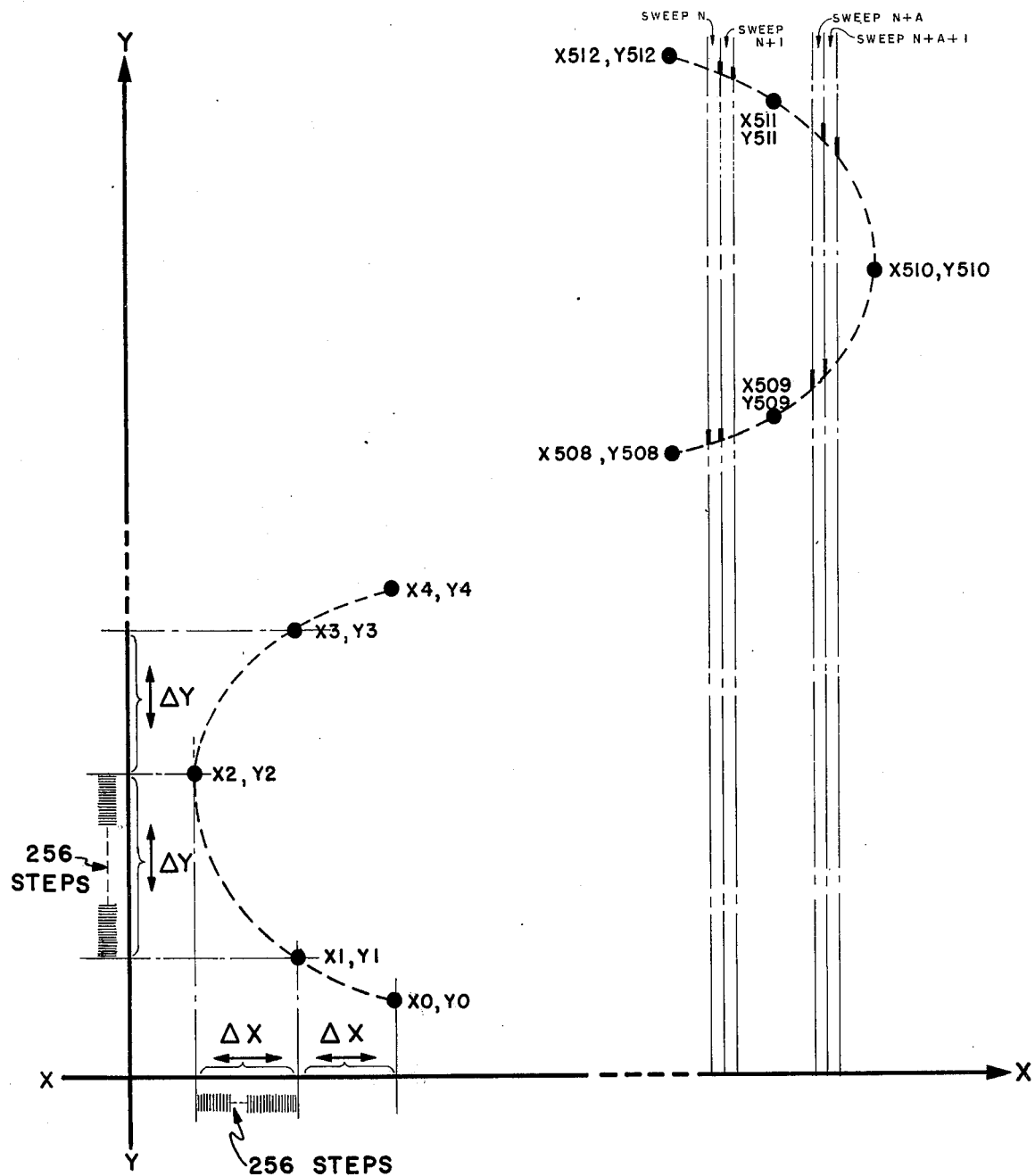
FIG. 6 is a representation of a curve and shows the various relationships between the interpolated values of the data points.

The operation of the interpolator is the same for both $\Delta X$ and $\Delta Y$. The $\Delta X$ and $\Delta Y$ values are shifted by 8 bits thus dividing them by 256. The results $\Delta X/256$ and $\Delta Y/256$ are then added to the current value for $X_n$ and $Y_n$, respectively. This step is repeated 256 times, giving, in sequence, $X_1 + \Delta X/256$, $X_1 + 2\Delta X/256$, $X_1 + 3\Delta X/256$, ..., $X_1 + 256\Delta X/256$. The last value obtained is equal to $X_2$. In this manner, the interpolator breaks down the steps between both the $\Delta X$ and the $\Delta Y$ data points into 256 small increments. In its operation, the circuitry begins at $X_1$, $Y_1$ goes to $X_2$, $Y_2$ and finally ends at $X_{512}$, $Y_{512}$. This is illustrated graphically in the diagram of FIG. 6 which shows sampled data points $X_1$, $Y_1$, $X_2$, $Y_2$, ..., $X_{512}$, $Y_{512}$, of a signal comprising a multi-valued function. The finite sweep band is shown for the $X_n$, $X_{n+1}$, $X_{n+a}$ and $Y_{n+a+1}$ sweeps. As previously pointed out, in this specific embodiment, the entire curve is printed in 1024 sweeps. Also illustrated in FIG. 6 are the short parallel marks along the Y sweep axis which go to make the hard copy of the curve. As previously explained, these Y-axis lines extend between the Y-axis values corresponding to the X-axis values where the curve entered and left the finite band.

The input labeled "XY COUNT" in FIG. 5 is the number of the particular "X" line of the paper strip across which the beam is to make a recording sweep. This "XY COUNT" signal from the XY counter shown in FIG. 3 is applied to an input of the comparator 150. The XY COUNT ranges from 0 to 1023, thus providing a total of 1024 lines per hard copy field.

The XY COUNT is compared with successive values of $X_n + a \cdot \Delta X_n/256$. The "X" crossing detector 152 senses the X interpolated output is in the finite band for the particular X-axis sweep; and, if it is, it produces an output signal which holds all corresponding values of $Y_n + a \cdot \Delta Y_n/256$ providing an interpolated Y-axis value. Depending on whether the Y value is positive or negative, the detector will hold the Y value in latch 160, designated $Y_{LOWER}$ or $Y_L$, or in latch 162 designated $Y_{UPPER}$ or $Y_U$.

When the X value leaves the band, the detector 152 transfers both the $Y_L$ and $Y_U$ addresses to the respectively associated one of the second set of latches 164 and 166. This results in the storage of information in the Y segment; that is, from $Y_L$ to $Y_U$, to be drawn on the hard copy. This information is loaded into the 1024 bit RAM 154, as a pulse train or string of "1's" between address $Y_L$ through address $Y_U$.

If additional X crossings occur additional strings of "1's" will be loaded into the RAM. Finally, when the interpolator has gone through $X_n + 256 \Delta X_n/256$ for each of the 512 data points, the information is ready to be put on the hard copy. As the beam of CRT moves across the fiberoptic strip, a counter in the control logic 92 of FIG. 1 steps from 0 through 1023. This count is used to address the RAM 154 to see if a "1" is stored at the address locations. The presence of a "1" indicates that a piece of some Y segment has been stored there during the interpolation and the CRT beam is unblanked for all such locations.

The RAM 154 is organized as 128 eight bit words. This allows the string of "1's" to be loaded in eight bits at a time which effectively provides eight times faster writing speed. Even at this rapid loading rate, the loading of the RAM may not be completed by the time the interpolator has two new values ready for $Y_L$ and $Y_U$. For this reason, the two stages of storage flip-flops in a two word first-in, first-out of FIFO are shown ahead of the RAM 154.

As will be appreciated by those skilled in the art, the successive values of $X_n + a \cdot \Delta X_n/256$ and $Y_n + a \cdot \Delta \lambda Y_n/256$ may conveniently be determined, respectively, by combination of intercoupled eighteen bit adder 170 and flip-flop 171 and eighteen bit adder 172 and its associated flip-flop 173.

The ten lines from the output of the latches 156 are connected to the input terminals $A_0 \ldots A_9$ of the adders 170 and 172, respectively. The eleventh line, that carries information as to "SIGN," is connected to the input terminals $A_9 \ldots A_{17}$ of the adders. The eighteen bit adder output terminals, 0 – 17 are connected to the input terminals of the eighteen bit $\Sigma X$ flip-flops. The eighteen output terminals of the flip-flops are connected back to terminals $A_0 - A_{17}$, respectively, of the adders. The ninth to the eighteen output lines of flip-flop 171, constituting the most significant bits, are connected to ten inputs of comparator 150. An XY COUNT is also applied to the inputs of the comparator 150. This XY COUNT is provided by the XY counter 112 of FIG. 3.

Three outputs of the comparator 150 are applied to the X crossing detector 152. These outputs are designated, respectively, "<", "=", and ">" (meaning less than, equal to and greater than, respectively). Thus, selective signals on these outputs indicate that the $X_n + a \cdot \Delta X_n/256$ is less than, equal to, or greater than the XY COUNT. Two additional inputs are provided for the detector 152. One of these is a connection from the eleventh output terminal flip-flop 156, that provides an indication of "SIGN" of the $\Delta Y$ being interpolated. The other is a connection from the output of the control unit to provide a reset signal.

The output of latches 156 are connected to the input terminal $A_0 - A_9$ of the adder 172. Additionally, the eleventh output line from latch 156 is connected to input terminals $A_{10} - A_{17}$ of the adder. The eighteen output lines of the adder are connected to the input terminals of the eighteen bit $\Sigma Y$ flip-flops 173 and the output terminals of flip-flops are connected to the input terminals $A_0 - A_{17}$ of the adder. The ten most significant bit output lines $A_8 - A_{17}$ of $\Sigma Y$ flip-flop 173 are connected to the input terminals of the $Y_L$ and $Y_U$ flip-flops 160 and 162.

Clock signals for the flip-flops 160 and 162 are derived from a clock through respectively associated AND gates 161 and 163. One input of each of these AND gates is connected to the clock terminal and their outputs are, respectively, connected to the clock terminal of the flip-flops 160 and 162. The other nput of the AND gate 161 is connected to an output of the X crossing detector, which output is identified as HALT $\Sigma Y_{LOWER}$. The other input of the AND gate 163 is connected to the output of the X crossing detector that is identified as HALT $\Sigma Y_{UPPER}$.

An output of the crossing detector that is identified as "BOTH $\Sigma Y$ READY" is connected to the clock inputs of the latches 164 and 166. This output terminal of the crossing detector is also connected to one input terminal of an OR gate 181 contained in the control. The other input of the OR gate identified as "CLR RAM" is connected to a "ONE SHOT" which provides a pulse signal at the appropriate time to clear the RAM 154 and to start the interpolator cycle.

The output of the OR gate 181 is connected to one input of a NAND gate 183 whose output is connected to one input of a NAND gate 185, the other input of which is connected to the output of a NAND gate 187. This pair of NAND gates form a set-reset flip-flop. The output of NAND gate 185, and thereby of the set-reset flip-flop is connected to the clock terminals of flip-flops 190 and 192, and also is connected to an input of a counter indicated at 194. The said output also is connected to an input of the X crossing detector which input is identified as "RESET BOTH $\Sigma Y$ READY STATUS".

The counter 194 also is provided with ten input lines which load the value of $Y_{LOWER}$ in for a starting address to write a string of "1's" into RAM 154. The output of the counter, comprising ten lines, and identified as "RAM ADDRESS," is connected to ten inputs of a 2 to 1 multiplexer. Ten inputs are also provided on the 2 to 1 multiplexer from the hard copy counter. The output of the multiplexer is connected to the RAM 154 to provide address signals for the latter.

The output of the RAM 154 is applied to a unit indicated at 195 for converting the eight parallel outputs of the RAM 154 to serial outputs of the information for controlling the electron beam of the CRT. The output of the parallel to serial converter is connected to one input of the OR gate 103. The output of the OR gate 103 is connected to the amplifier 74 for controlling the blanking and unblanking of the electron beam of the CRT.

Figure 7:
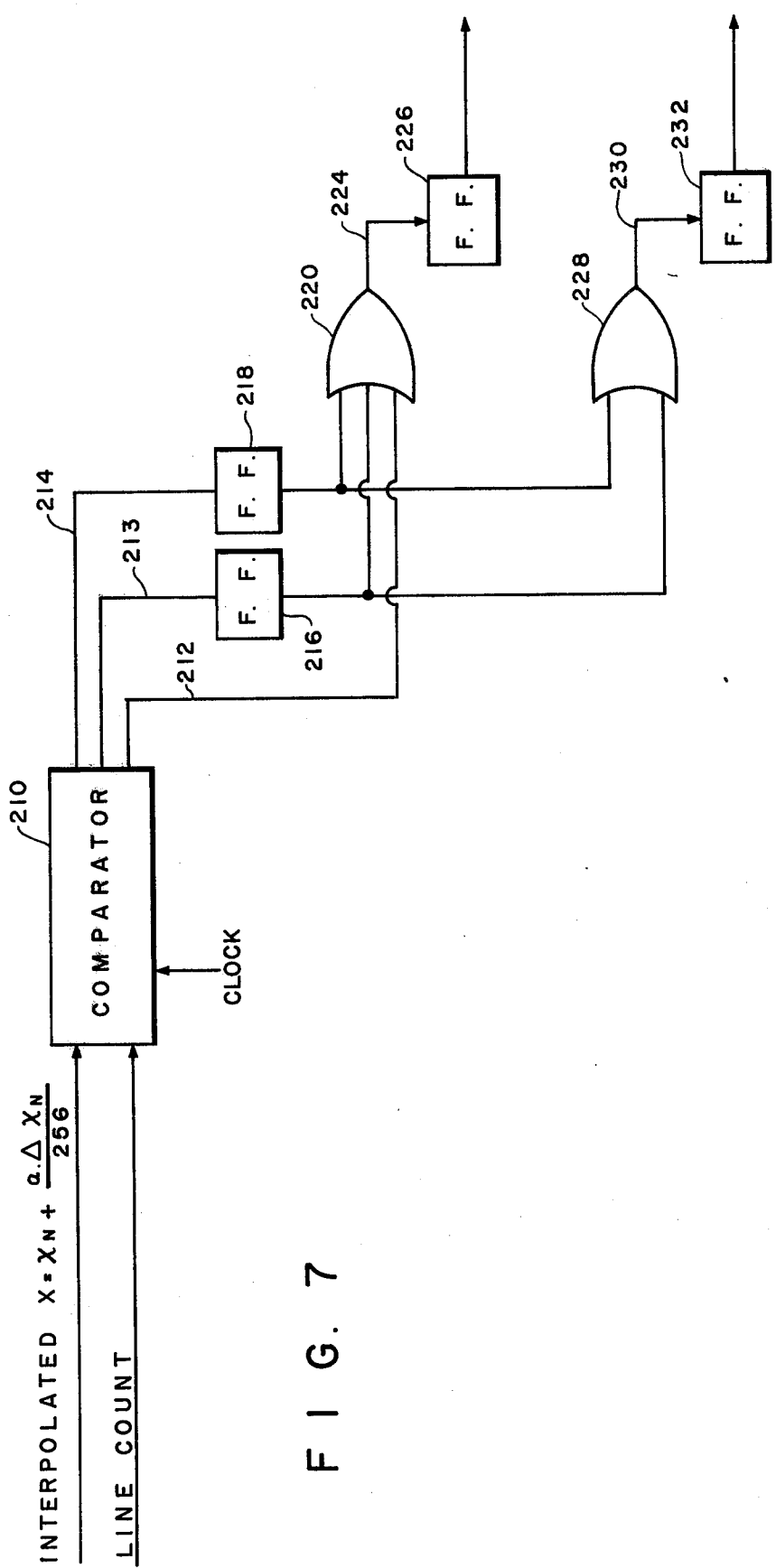
FIG. 7 is a simplified block diagram of a circuit for comparing the interpolated X values with the position of the media relative to the line scan beam and also the X-crossing detector.

FIG. 7 shows a simplified block of the less than, equal to or greater than (<, =, >) comparator and the X crossing detector.

The comparison between successive interpolated values of X and the line count may be made in a commercially available integrated circuit 10 bit comparator 210. For each successive comparison, in response to a clock pulse input, the comparator produces an output on one of the three output lines 212, 213 or 214 indicating, respectively, that the increment of $X_n$ is equal to, greater than or less than the line count. Flip-flops 216 and 218 store the result of a previous comparison if interpolated X value was respectively greater than or less than the previous line count.

In operation, for example, if line scan 600 is to be recorded, the number 600 may be set in the comparator. So long as the interpolated value is less than 600 (599.7, for example), the comparator output will indicate that the interpolated value is less than the scan line count. If a successive interpolated value becomes 600.25, the decimal position of the value may be ignored and the comparator will indicate that the line count and interpolated value are equal. This equal indication will continue for interpolated value of X up to 601. For interpolated values of 601 or greater, the comparator provides a greater than indication.

In the event two successive interpolated $\Delta X/256$ values cross the line count but do not equal it, the change in the state of flip-flop 216 or 218 indicates the X-axis crossing. A single dot may be recorded at this crossing point.

Logic represented by an OR gate 220 combines the outputs of flip-flops 216 and 218 and the output on 212 to produce a single output on line 224 indicating the initial crossing of the X-axis by the interpolated value of X. This output on line 224 sets a flip-flop 226. An output from flip-flop 226 is coupled to the $Y_{UPPER}$ and the $Y_{LOWER}$ flip-flops of FIG. 5 and indicates the initial X-axis crossing triggering the $Y_{UPPER}$ or $Y_{LOWER}$ flip-flop depending upon the sign of $\Delta Y$.

Another OR gate 228 logically combines the outputs from flip-flop to produce an output on line 230 to trigger a flip-flop 232 signifying the second X crossing of the line count by the interpolated X value. The output of flip-flop 232 is coupled to the $Y_U$ and $Y_L$ flip-flops so that the corresponding interpolated Y value is stored as appropriate as $Y_U$ or $Y_L$ depending upon the sign of $\Delta Y$.

It will be appreciated that the logic circuitry of FIG. 7 is greatly simplified in order to facilitate understanding of its functional generation. Clocking signals and reset signals, for example, have been omitted as such techniques are well known to those skilled in the art. In addition, it will be appreciated that it is possible that the interpolated X value will cross the X-axis line count only once for a given $\Delta X$. In this case, the last interpolated value $256\Delta X_n/256$ may be used to set the flip-flop 226. Similarly, it is possible that the interpolated values will skip across one or more of the finite bands as, for example, where the curve is a straight line in the X-axis direction. In this situation, a single dot is drawn at the last Y-axis position.

Finally, it should be noted that in scanning all 512 data points before each recording scan of the beam all the values for multi-value function are accounted for. Thus, it will be appreciated that the objects of the invention have been accomplished. A method and apparatus has been disclosed for producing hard copy graphic outputs of multi-value functions with a line scan CRT hard copy recorder. The output approximates a smooth and continuous trace faithfully representing the multi-value function or functions by drawing successive substantially parallel lines on a photosensitive recording sheet.

The embodiment of the invention in which an exclusive property or privilege is claimed are defined as follows:

1. Apparatus for making a hard copy record on a recording medium from a series of data points with a line scan recorder which records an area on the recording medium in a predetermined number of line scans, comprising in combination:
   means for recording in a region on said medium with parallel line scans along one of two intersecting axes, a region between two adjacent line scan positions defining a finite band;
   means for determining the distance between two data points along the one of said two intersecting axes;
   means for determining the distance between said two data points along the other of said two axes;
   means to divide said distance along said one axis into a predetermined number of increments;
   means to divide said distance along said other axis into a predetermined number of increments;
   means for determining the position of said medium relative to said recording means along said one axis;
   means including said dividing means for determining interpolated values along said one axis between said data points;
   means including said dividing means for determining interpolated values along said other axis between said data points;
   means for determining the interpolated values along said one axis falling within said finite band;
   means for determining the interpolated values along said other axis corresponding with the interpolated values along said one axis that are within said finite band; and
   means responsive to said means for determining interpolated values along said other axis within said finite band for recording along said other axis a line whose length is a function of the interpolated values along said one axis falling within said finite band.

2. Apparatus for making a hard copy record on a recording medium from a series of data points with a line scan recorder which records an area on the recording medium in a predetermined number of line scans, comprising in combination:
   means for recording in a region on said medium with parallel line scans along one of two orthoginal axes a region between two adjacent line scan positions defining a finite band;
   means for storing a plurality of data points including means for storing the coordinate position of each of said data points along one of said two axes and the coordinate position of each of said data points along the other of two said axes;
   means for successively determining the distance from each of said data points, respectively, to the next data point along said one axis;
   means for successively determining the distance from each of said data points, respectively, to the next data point along the other of said axes;
   means to successively divide said distances between data points along said one axis into a predetermined number of increments;
   means to successively divide said distances between data points along said other axis into a predetermined number of increments;
   means for determining the position of said medium relative to said recording means along said one axis;
   means including said dividing means for determining interpolated values along said one axis between each of said plurality of data points, respectively, and the next data point;
   means including said dividing means for determining interpolated values along said other axis between each of said data points, respectively, and the next data point;
   means for determining the interpolated values along said one axis falling within said finite band;
   means for determining the interpolated values along said other axis corresponding with all the interpolated values along said one axis that are within said finite band;
   means for storing said interpolated values along said other axis corresponding with the interpolated values along said one axis that are within said finite band; and means responsive to said storing means for recording along said other axis a line whose length is a function of the stored interpolated values.

3. Apparatus for making a hard copy record on a recording medium from a series of data points with a line scan recorder which records an area on the recording medium in a predetermined number of line scans as specified in claim 2 wherein said plurality includes at least 100 data points.

4. Apparatus for making a hard copy record on a recording medium from a series of data points with a line scan recorder which records an area on the recording medium in a predetermined number of line scans, comprising in combination:

means for recording in a region on said medium with parallel line scans along one of two orthoginal axis a region between two adjacent line scan positions defining a finite band;

means for storing a plurality of data points including means for storing the coordinate position of each of said data points along one of said two axes and the coordinate position of each of said data points along the other of two said axes;

means for successively determining the distance and relative direction from each of said data points, respectively, to the next data point along said one axis;

means for successively determining the distance and relative direction from each of said data points, respectively, to the next data point along the other of said axes;

means to successively divide said distance between data points along said one axis into a predetermined number of increments;

means to successively divide said distances between data points along said other axis into a predetermined number of increments;

means for determining the position of said medium relative to said recording means along said one axis;

means including said dividing means for determining interpolated values along said one axis between each of said plurality of data points, respectively, and the next data point;

means including said dividing means for determining interpolated values along said other axis between each of said data points, respectively, and the next data point;

means for determining the interpolated values along said one axis falling within said finite band;

means for determining the interpolated values along said other axis corresponding with all the interpolated values along said one axis that are within said finite band;

means for storing said interpolated values along said other axis corresponding with the interpolated values along said one axis that are within said finite band said storing means including means responsive to said means for determining the relative positions of said data points to store said values in accordance with said relative position; and means responsive to said storing means for recording along said other axis a line whose length is a function of the stored interpolated values.

5. Method for making a hard copy record on a recording medium from a series of data points with a line scan recorder which records an area on the recording medium in a predetermined number of line scans, comprising the steps of:

recording in a region on said medium with parallel line scans along one of two intersecting axes, a region between two adjacent line scan positions defining a finite band;

determining the distance between two data points along the one of said two intersecting axes;

determining the distance between said two data points along the other of said two axes;

dividing said distance along said one axis into a predetermined number of increments;

dividing said distance along said other axis into a predetermined number of increments;

determining the position of said medium relative to said recording means along said one axis;

determining interpolated values along said one axis between said data points;

determining interpolated values along said other axis between said data points;

determining the interpolated values along said one axis falling within said finite band;

determining the interpolated values along said other axis corresponding with the interpolated values along said one axis that are within said finite band; and determining interpolated values along said other axis within said finite band for recording along said other axis a line whose length is a function of the interpolated values along said one axis falling within said finite band.

6. Apparatus for making a hard copy record on a recording medium from a series of data points with a line scan recorder which records an area on the recording medium in a predetermined number of line scans, comprising in combination:

means for recording in a region on said medium with parallel line scans along one of two intersecting axes, a region between two adjacent line scan positions defining a finite band;

means for determining the distance between two data points along the one of said two intersecting axes;

means for determining the distance between said two data points along the other of said two axes;

means for determining the position of said medium relative to said recording means along said one axis;

means for determining interpolated values along said other axis between said data points;

means for determining the interpolated values along said other axis that are within said finite band; and means responsive to said means for determining interpolated values along said other axis within said finite band for recording along said other axis a line whose length is a function of the interpolated values along said one axis falling within said finite band.

* * * * *